United States Patent
Elam et al.

(10) Patent No.: US 8,951,615 B2
(45) Date of Patent: Feb. 10, 2015

(54) DOPING CONTROL BY ALD SURFACE FUNCTIONALIZATION

(75) Inventors: Jeffrey W. Elam, Elmhurst, IL (US); Angel Yanguas-Gil, Naperville, IL (US)

(73) Assignee: UChicago Argonne, LLC, Chicago, IL (US)

( * ) Notice: Subject to any disclaimer, the term of this patent is extended or adjusted under 35 U.S.C. 154(b) by 221 days.

(21) Appl. No.: 13/370,602

(22) Filed: Feb. 10, 2012

(65) Prior Publication Data

US 2012/0213946 A1 Aug. 23, 2012

Related U.S. Application Data

(60) Provisional application No. 61/443,579, filed on Feb. 16, 2011.

(51) Int. Cl.
| | | |
|---|---|---|
| C23C 16/44 | (2006.01) | |
| B05D 5/06 | (2006.01) | |
| C23C 16/08 | (2006.01) | |
| C23C 16/455 | (2006.01) | |

(52) U.S. Cl.
CPC ........... *C23C 16/08* (2013.01); *C23C 16/45553* (2013.01)
USPC .......... 427/569; 427/248.1; 427/58; 427/162; 427/157

(58) Field of Classification Search
None
See application file for complete search history.

(56) References Cited

U.S. PATENT DOCUMENTS

| | | |
|---|---|---|
| 5,322,712 A | 6/1994 | Norman et al. |
| 7,081,271 B2 | 7/2006 | Chung et al. |
| 7,592,254 B2 | 9/2009 | Abelson et al. |
| 2007/0218290 A1* | 9/2007 | Rajala et al. ............... 428/411.1 |
| 2008/0242097 A1* | 10/2008 | Boescke et al. ............... 438/703 |
| 2009/0246931 A1* | 10/2009 | Huotari et al. ................ 438/398 |
| 2010/0062149 A1 | 3/2010 | Ma et al. |

* cited by examiner

*Primary Examiner* — Mandy Louie
(74) *Attorney, Agent, or Firm* — Foley & Lardner LLP (57) ABSTRACT

Systems and methods for producing a material of desired thickness. Deposition techniques such as atomic layer deposition are alter to control the thickness of deposited material. A funtionalization species inhibits the deposition reaction.

17 Claims, 6 Drawing Sheets

DOPING CONTROL BY ALD SURFACE FUNCTIONALIZATION

CROSS REFERENCE TO RELATED APPLICATIONS

This application claims priority from U.S. Provisional Patent Application No. 61/443,579, filed Feb. 16, 2011, the entire contents of which are herein incorporated by reference in its entirety.

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

FIELD OF THE INVENTION

The present invention is directed to a method and system using a surface functionalization step for controlled growth of a product or composition of matter. More particularly, the method and system concern use of alkyl alcohols (ROH), ketones, beta diketonates, and carboxylic acids for the growth of doped materials by controlling the saturation growth rate during the Atomic Layer Deposition (ALD) of metal oxides, metal sulfides, nitrides, noble metals, and other classes of materials.

BACKGROUND OF THE INVENTION

The properties of doped thin films depend not only on the dopant concentration, but also on the position, bonding, and spatial distribution of the dopants, which control the fraction of active dopants (doping efficiency). Thin film growth techniques such as chemical vapor deposition, sputtering or evaporation lack the ability of actively controlling the local environment of the dopant.

Atomic layer deposition (ALD) is a thin film growth method using alternating, self limiting reactions between gaseous precursors and a solid surface to deposit materials monolayer-by-monolayer. Due to its self-limited layer-by-layer nature, ALD provides a partial degree of control of dopant distribution in the direction of growth. The amount of dopant per layer is controlled by the saturation coverage, which is a given value for every precursor/coreactant combination. This leads to strongly inhomogeneous doping profiles for low dopant concentrations. Previous reported strategies to allow more doping control include searching for precursors with lower growth rate per cycle, and operating below the saturation coverage at the expense of losing the homogeneity and conformality of ALD. Consequently, substantial problems currently prevail with use of ALD for growth of metal oxides, metal sulfides, and other materials with prescribed dopant profiles.

SUMMARY OF THE INVENTION

The process described herein provides enhanced control of the chemical environment of dopants, finer control of the doping profiles in doped materials. It allows the growth of doped thin films with higher doping efficiencies. The dopants are inserted by ALD on a functionalized surface of the matrix host. The introduction of this additional surface functionalization step induces changes in the surface-precursor interaction and controls the growth per cycle in ALD. By providing a way of attaching and removing the surface functional groups in situ, we can carry out this process in a continuous layer by layer fashion, and the control of the amount of material deposited per-cycle allows us to tailor the dopant distribution in the film independent of its composition and also to grow thinner films while maintaining precise dopant concentrations. In addition to allowing a better dopant control, through this method we are able to achieve submonolayer conformal coatings on high aspect ratio features, for instance to decorate the surface with ALD-grown nanoparticles The use of in-situ functionalization species to moderate the growth rate has been reported in the art concerning chemical vapor deposition (CVD), as a way of enhancing the conformality of films. However, the requirements for ALD are very different than in CVD. As mentioned above, due to the pulsed nature of ALD, the interaction of the functionalization species with the surface must be self-limited and must involve the formation of chemically strong bonds with the surface so that the surface functionalization species survive the purge times between dosing steps. The functional groups incorporated on the surface must be chemically compatible with the precursors involved in the ALD step, and reactive to at least one of the other species, in order to avoid incorporating impurities in the film from residual functionalization species. In at last two examples in the prior art, ligands have been dosed to modify the substrate, and therefore influence the nucleation behavior in ALD. In these cases, the choice of inhibitors was influenced by the chemistry of the growth systems, and stable molecules containing precursor ligands were used. However, it is important to realize that any species that leads to surface functionalization at the temperature of the ALD process can potentially act as a growth moderator.

Alkyl alcohols (ROH), carboxylic acids, ketones and beta diketonates are applied herein as surface functionalization species. The key issues are the presence in the functionalization species of a ligand or moiety that establishes stable surface bonds with the surface and also that the functionalization species can be removed by another co-reactant. For instance, ROH species can adsorb on metal oxide surfaces forming alkoxides and carboxylates depending on the temperature and the nature of the surface metal cation. Surface alkoxilation using alkyl alcohols is used herein as an example for the methodology derived for controlling the growth per cycle and the doping distribution in ALD.

BRIEF DESCRIPTION OF THE DRAWING

6(b) illustrates fractional coverage of EtO-surface groups as a function of time; and the dotted line is a fit to a first order desorption kinetics.

DETAILED DESCRIPTION OF PREFERRED EMBODIMENTS

The method and system of the invention are based on the modulation of the precursor-surface reactivity by inserting into the ALD process an in-situ surface functionalization step that reduces the density of surface reactive sites, effectively allowing sub-monolayer saturation coverage while preserving the self-limiting aspect of ALD that is crucial to obtaining uniform films. After the self-limited reaction with the precursor, the functional groups are removed in a later step. Both steps are carried out in-situ, so that the process of dopant insertion can be carried out in a continuous mode. Since the reactivity is directed towards not functionalized surface sites, it allows for site-selective deposition. Since one of the central applications is the growth of doped materials, the chemical composition of the surface can be generally different from that of the material grown during the ALD step.

Chemical species used for surface functionalization in ALD must fulfill the following requirements: i) they must bond strongly enough to survive the purging times between dosing steps under an inert nitrogen or noble gas atmosphere; ii) they must be able to infiltrate into high aspect ratio features to preserve the conformality of ALD; iii) they must not be completely displaced by the precursor molecules during the dosing step; and iv) they must be removed without leaving impurities during the coreactant step. Any chemical precursor able to react with the surface of the matrix host and leave the desired dopant on the surface can be used to generate the dopant layer. This includes, but it is not limited to, ALD precursors. The matrix host can be grown by any thin film grown technique, including Atomic Layer Deposition. The nature of the host is also general, as long as it allows functionalization of its surface and the required reactivity towards the dopant precursor.

Herein, as a particular embodiment of our invention, the use of alkyl ROH molecules (R=Me, Et, $^i$Pr) is described for surface functionalization for the growth of different metal oxides by ALD. By comparing the M/O and ROH/M/O sequences the role is determined for the surface alkoxilation on the surface coverage of the metal precursor as a function of the ROH dosing time and surface temperature. The precursors specifically evaluated include trimethyl aluminum (TMA), diethyl zinc (DEZ), titanium tetrachloride (TiCl$_4$), and titanium tetraisopropoxide [Ti(O$^i$Pr)$_4$], and the preferred oxygen source is H$_2$O. In-situ quartz crystal microbalance experiments provide insight into the mechanistic processes taking place on the surface. Doped materials are created by applying this system and method to the growth of Al-doped ZnO films. The use of a growth inhibitor has a noticeable influence on the properties of the materials, with lower resistivities achieved at higher TMA:DEZ ratios. Preliminary results on Al doped TiO$_2$ and Sn doped In$_2$O$_3$ indicate that the use of surface functionalization to reduce the dopant density is also effective in these systems.

Figure 1A:
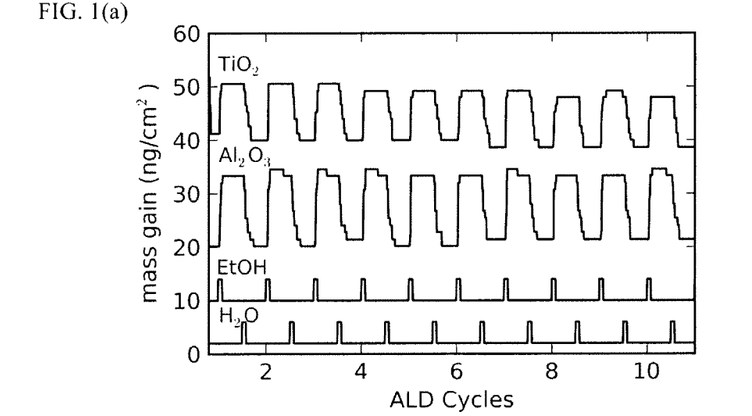
FIG. 1(a) illustrates QCM mass signals during alternating EtOH/$H_2O$ doses on $Al_2O_3$ and $TiO_2$.

To evaluate the adsorption/desorption behavior of alkyl alcohols on metal oxide surfaces, we used an in-situ quartz crystal microbalance (QCM) to monitor the mass changes during alternating, is pulses of alkyl alcohol and H$_2$O separated by 5 s purge periods. FIG. 1(a) shows the mass increase/decrease upon insertion of 0.1 Torr pulses of ethanol (EtOH) and H$_2$O for Al$_2$O$_3$ and TiO$_2$ surfaces grown in-situ by ALD using Al(CH$_3$)$_3$ (TMA) and TiCl$_4$, respectively, and H$_2$O as coreactant. During the purge times between pulses no mass changes were observed. The oscillating behavior indicates the reversible nature of the adsorption/desorption process.

In-situ mass spectrometry (MS) measurements showed an increase of mass fragment m/z=31 (attributed to CH$_2$OH$^+$, the dominant crack of EtOH) during the H$_2$O pulses after an EtOH pulse. During subsequent H$_2$O exposures, the m/z=31 signal intensity dropped to background levels. When D$_2$O was used as the coreactant, an increase of mass m/z=19 (DOH$^+$) was observed during the ethanol pulses and an increase of m/z=32 (CH$_2$OD$^+$) was observed during the subsequent D$_2$O pulses. These results are consistent with the dissociative adsorption of EtOH on the Al$_2$O$_3$ and TiO$_2$ surfaces and the subsequent displacement of the functional groups by H$_2$O.

Figure 1B:
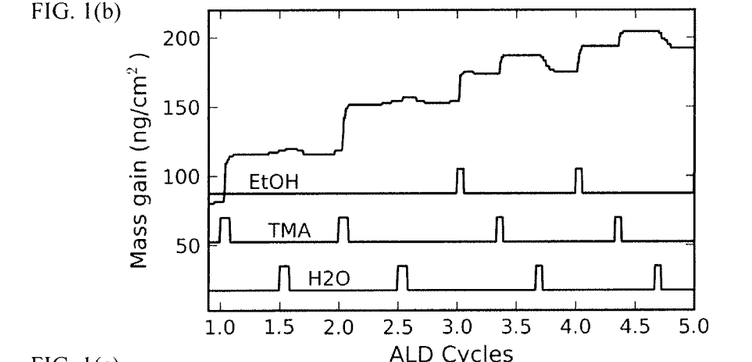
FIG. 1(b) illustrates QCM mass gain during $Al_2O_3$ growth using TMA/$H_2O$ and EtOH/TMA/$H_2O$ doses.
Figure 1C:
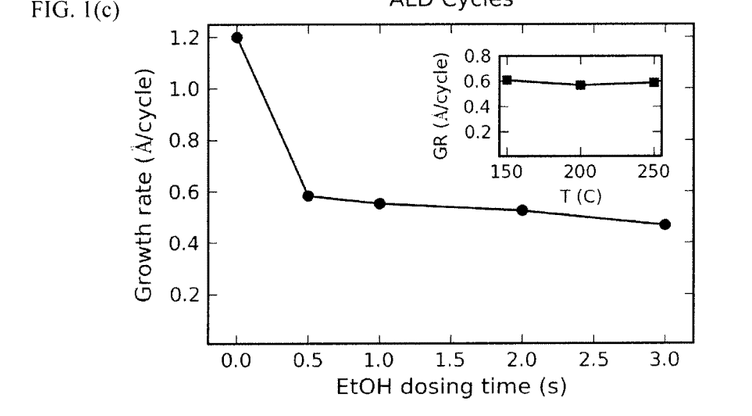
FIG. 1(c) illustrates influence of EtOH dose time and growth temperature (inset) during $Al_2O_3$ growth from EtOH/TMA/$H_2O$.

The impact of the surface functionalization step on Al$_2$O$_3$ ALD is shown in FIG. 1(b). The QCM data for TMA/H$_2$O reproduced the well-known behavior reported in the literature: a mass increase during the TMA pulse and almost no net mass change during the H$_2$O pulse. However, in the EtOH/TMA/H$_2$O sequence, the mass increase during the TMA dose that followed the EtOH pulse was lower, and during the H$_2$O pulse a mass reduction was observed. Moreover, the net mass increase per cycle was smaller in the EtOH/TMA/H$_2$O sequence. These results are consistent with EtOH partially blocking the TMA adsorption and subsequently desorbing during the H$_2$O pulse. By changing the EtOH dose time we established the self-limiting nature of the EtOH adsorption process (see FIG. 1(c)). The inset of FIG. 1(c), shows that the inhibition is almost temperature independent in the range considered.

TABLE 1

Effect of alkyl alcohol functionalization on the growth per cycle of ALD of selected precursors with H$_2$O. Values are presented normalized to the values obtained without functionalization.

| | TMA | Zn(CH$_2$CH$_3$)$_2$ | TiCl$_4$ | TTIP |
|---|---|---|---|---|
| MeOH | 0.40 | | | 0.22 |
| EtOH | 0.48 | 0.47 | 0.39 | 0.26 |
| $^i$PrOH | 0.52 | | | 0.26 |

The ex-situ measured growth rates confirmed the growth modulation due to surface functionalization. Table 1 shows the effect of different alkyl alcohols and ALD precursors during the ALD of metal oxides with H$_2$O where the data has been normalized to the growth rate observed in the absence of alkyl alcohol functionalization. A comparison between methanol (MeOH), EtOH and $^i$PrOH shows a slightly higher inhibition for MeOH. Table 1 also shows that the inhibition strongly depends on precursor chemistry: TTIP being more strongly inhibited than TiCl$_4$. No growth reduction whatsoever was observed when the sequence EtOH/H$_2$O/TMA/H$_2$O was used.

Depth-profiling X-ray photoelectron spectroscopic analysis showed carbon impurity levels below the detection limit (0.5%) throughout the thickness of the film. Likewise, the optical properties of the films as determined by ex-situ spectroscopic ellipsometry were not affected by the functionalization step (see supporting info). These measurements confirm negligible incorporation of the functionalization species into the film.

Figure 2:
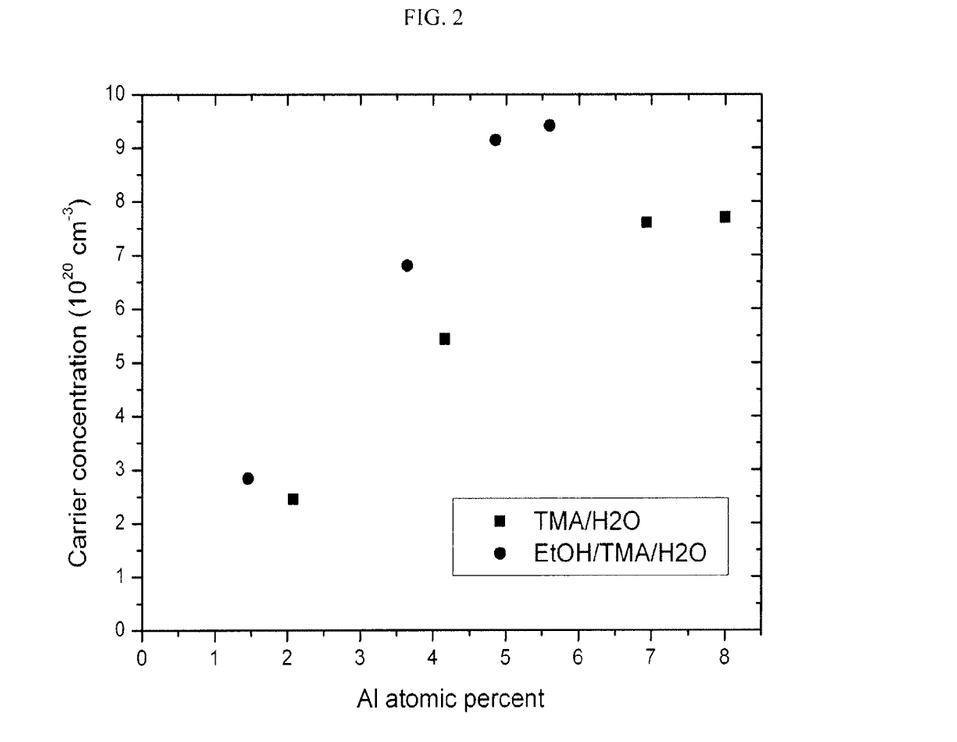
FIG. 2 illustrates free carrier concentration as a function of the Al atomic percent in Al:ZnO films.

This methodology has been applied to the growth of Al doped ZnO (Al:ZnO) by ALD. Al:ZnO is a transparent conducting material and an n-doped degenerate semiconductor upon Al substitutional doping of the Zn sites. We varied the Al doping by executing super-cycles consisting of a number of ZnO ALD cycles followed by 1 $Al_2O_3$ ALD cycle.[15] We prepared films with and without EtOH surface functionalization prior to the TMA dose. The compositions were determined by X-ray fluorescence measurements. A 30% reduction in Al incorporation was observed for a given N value due to EtOH surface functionalization. Remarkably, Hall probe measurements revealed that the films prepared using the surface functionalized ALD exhibited higher carrier concentrations of up to 50% for the same Al concentration in the films (see FIG. 2). The increase in doping efficiency is a direct consequence of the more efficient distribution of dopants in the ZnO host. The lower density packing of Al atoms using surface-functionalized ALD reduces the probability of forming Al—O—Al clusters that may not be active as donors.

Extending of this methodology to species other than alkyl alcohols provides a wide range of saturation coverages, as well as selective surface site blocking. This methodology has been used to control thin film and nanoparticle nucleation in ALD. We have presently extended this methodology to other compounds including carboxylic acids, ketones and beta-diketones, using water, hydrogen, and hydrogen disulfide as co-reactants and different dopants including metals, transition metals and rare earth materials. This method could also be applied to the doping of non-metals, semiconductors, and semimetals using the appropriate combination of chemical species. We have also utilized this method to reduce the surface concentration of noble metal species deposited on high surface area silica gel supports by ALD resulting in smaller noble metal nanoparticles.

The following non-limiting Examples describe illustrative experimental procedures and conditions used in the method of the invention and results for selected products.

EXAMPLE 1

The ALD films were deposited in a conventional, well known form of viscous flow reactor. The particular design of the deposition reactor is immaterial for the realization of this invention, other than ensuring the delivery of precursor gases to the substrate. Ultrahigh purity nitrogen (99.999%) carrier gas was used at a mass flow rate of 360 sccm and a pressure of 1 Torr. Trimethyl aluminum, diethyl zinc, titanium tetrachloride, titanium tetraisopropoxide, and methanol, absolute dry ethanol, and isopropanol were purchased from Aldrich and used as received. Metal oxide films were deposited by ALD using alternating exposures to $TMA/H_2O$, $DEZ/H_2O$, and both $TiCl_4/H_2O$ and $Ti(O^iPr)_4/H_2O$ to deposit films of $Al_2O_3$, ZnO, and $TiO_2$, respectively. $Ti(O^iPr)_4$ was placed in a stainless steel bubbler heated at 45° C. Ultrahigh purity nitrogen at a mass flow of 50 sccm was passed though the bubbler during the $Ti(O^iPr)_4$ exposures. The ALD timing sequences can be expressed as t1-t2-t3-t4 where t1 is the exposure time for the first precursor, t2 is the purge time following the first precursor exposure, t3 is the exposure time for the second precursor, and t4 is the purge time following the second precursor exposure and all units are given in seconds (s). The influence of ROH was determined by using $ROH/M/H_2O$ sequences, where the timing sequences can be expressed as t1-t2-t3-t4-t5-t6. The typical dosing times used in these studies were 1 s for TMA, DEZ, $TiCl_4$, ROH, and $H_2O$, and 8 s for $Ti(O^iPr)_4$. All purge times were 5 s unless stated otherwise. Unless indicated otherwise, the growth temperature was set to 200 C.

The ALD growth was monitored in situ using a quartz crystal microbalance (QCM) and a quadrupole mass spectrometer (QMS). The QCM utilized a Maxtek BSH-150 bakeable sensor and AT-cut quartz sensor crystals with a polished front surface connected to a Maxtek TM400 film thickness monitor. The QMS (Stanford Research Systems RGA300) was located downstream of the QCM in a differentially-pumped chamber separated from the reactor tube by a 35 micron orifice and evacuated using a 50 l/s turbomolecular pump. Ex-situ thickness and optical properties were measured on flat Si 100 pieces using a J. A. Woolam Co. Alpha-SE spectroscopic ellipsometer. XPS depth profiling of the samples was carried out by Evans Analytical.

Figure 3:
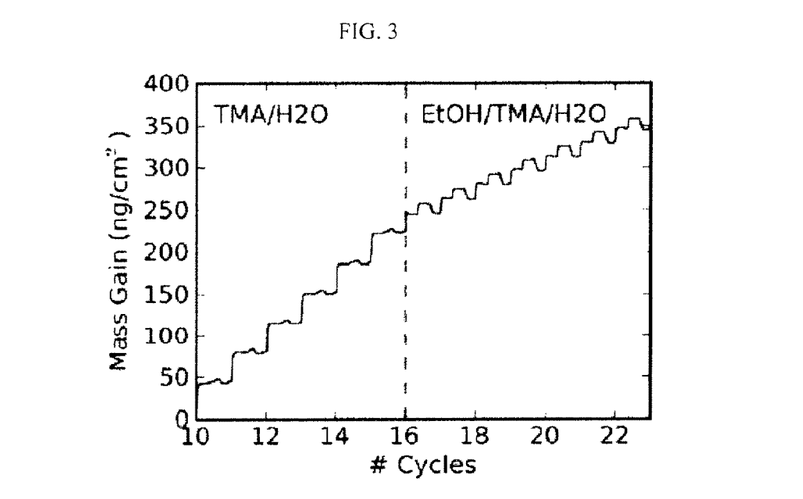
FIG. 3 illustrates mass gain per cycle.

Quartz crystal microbalance measurements are in agreement with the ex-situ measurements reported above and help to understand the nature of the mechanism. In FIG. 3 we present the mass gain as a function of the cycle number for $TMA/H_2O$ and $EtOH/TMA/H_2O$ sequences. The change of overall slope in the mass gain indicates a lower mass gain per cycle, from 42 to 20 $ng/cm^2$ at 200° C. For comparison, no inhibition was observed with the $EtOH/H_2O/TMA/H_2O$ sequence. As described herein before the evolution of the mass gain during the $TMA/H_2O$ and $EtOH/TMA/H_2O$ pulse sequence is presented in FIG. 1(b). During the EtOH pulse, a mass increase is observed due to the adsorption of EtOH on the $Al_2O_3$ surface. Then, the mass gain during the TMA pulse is much smaller in the $EtOH/TMA/H_2O$ than in the $TMA/H_2O$. Upon dosing of $H_2O$, a decrease in the mass is observed, corresponding to the desorption of the EtOH from the $Al_2O_3$ surface. These observations are consistent with a mechanism in which the EtOH adsorbs to the $Al_2O_3$ surface and blocks potential adsorption sites for the TMA leading to a lower $Al_2O_3$ growth per cycle. During the subsequent $H_2O$ exposure, the surface becomes rehydroxylated and the EtOH is released from the surface.

EXAMPLE 2

Figure 4A:
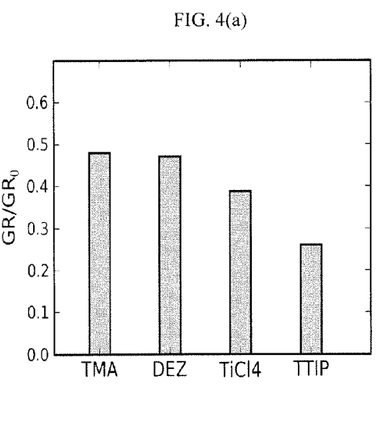
FIG. 4(a) illustrates normalized growth per cycle for different ALD precursors using EtOH/M/$H_2O$ pulsing sequences.

The behavior presented for $TMA/H_2O$ is representative of the experimental observations for the DEZ, $TiCl_4$ and $Ti(O^iPr)_4$ precursors. In FIG. 4(a) we present a comparison of the growth per cycle for the $EtOH/M/H_2O$ sequence normalized to that of $M/H_2O$ (GR/GR0) for 1-5-1-5-1-5 and 1-5-1-5 timings. The growth decrease is approximately 50% for TMA and DEZ and 60% for $TiCl_4$, but up to 75% for $Ti(O^iPr)_4$ (TTIP). The comparison of $Ti(O^iPr)_4$ and $TiCl_4$ illustrates both the metal oxide and the specific precursor contribute to the reduction of the growth per cycle. From QCM measurements, the mass gain during the EtOH pulse is the same for both precursors, indicating similar surface coverages of the ethoxide groups. Therefore, the difference in inhibition observed is due to the bigger overlap between the EtOH and precursor adsorption sites in the case of $Ti(O^iPr)_4$.

Figure 4B:
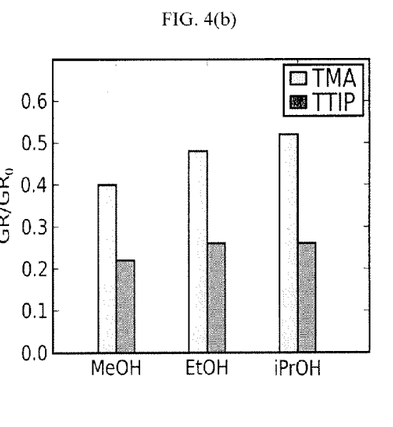
FIG. 4(b) illustrates influence of the alkyl group in the growth per cycle of TMA and $Ti(O_rPr)_4$(b)

Other alkyl alcohols present similar effects. In FIG. 4(b), we compare the effect of MeOH, EtOH, and $^iPrOH$ on the ALD of TMA and $Ti(O^iPr)_4$. In both cases the reduction in growth per cycle is greater in the case of MeOH than in EtOH, while both the EtOH and the $^iPrOH$ present similar inhibition effects. This is consistent with the literature on alkyl alcohol adsorption on metal oxides, which suggest that MeOH is less selective upon adsorption than EtOH and therefore can achieve larger surface coverages.

Figure 5:
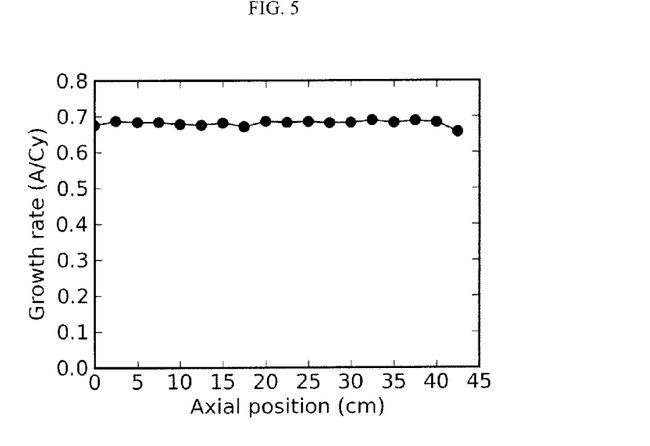
FIG. 5 illustrates growth per cycle as a function of the axial position of ZnO films obtained by ALD using a EtOH/DEZ/$H_2O$ pulse sequence.

The reduction in the growth per cycle was constant along the reactor. In FIG. 5 the growth per cycle using the 1-5-1-5-1-5 EtOH/DEZ/H$_2$O sequence is independent of the axial position along the length of the reactor, thus showing the scalability of this approach to higher substrate areas.

EXAMPLE 3

Figure 6A:
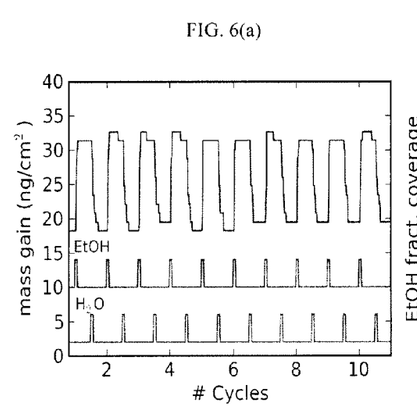
FIG. 6(a) illustrates mass gain during EtOH/$H_2O$ pulses on an $Al_2O_3$ surface grown in-situ from TMA/$H_2O$; and FIG.
Figure 6B:
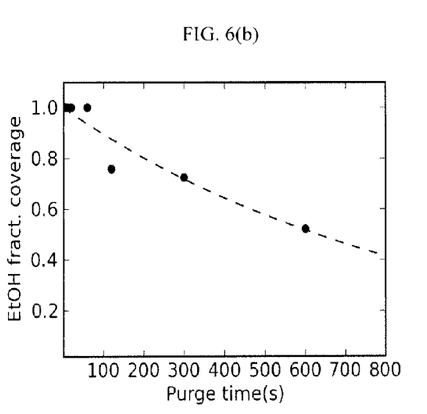

We also studied the stability of the EtO— surface groups on an Al$_2$O$_3$ surface. By dosing EtOH/H$_2$O pulses on an Al$_2$O$_3$ surface grown in-situ on the QCM using TMA/H$_2$O, we determined the mass gain during the EtOH pulse and the mass loss during the H$_2$O pulse as a function of the purge time x between the two pulses in 1-x-1-5 sequences. The results obtained, shown in FIG. 6(a) for 1-5-1-5 sequences, confirm the complete displacement of EtOH during the H$_2$O pulses. At longer purge times, a difference is observed between the mass gain $\Delta m_g$ during the EtOH pulse and the mass loss $\Delta m_l$ during the subsequent H$_2$O pulse. This difference can be attributed to EtO— desorption due to surface relaxation or to interaction with residual water during the purge periods. In particular, the $\Delta m_l/\Delta m_g$ ratio offers a lower boundary of the fractional coverage still present in the surface (assuming that all the loss comes from EtOH molecules leaving the surface). As shown in FIG. 6(b), for purge times below 60 s the difference in mass is below the experimental error (1 ng). After 600 s, the fractional coverage is still above 50%. If a first order desorption kinetics is assumed, the corresponding half-life of the EtO-surface groups is of 630 s at 200° C.

From the mass gain observed during the EtOH pulse on Al$_2$O$_3$ and TiO$_2$ surfaces using QCM it is possible to obtain upper and lower estimates of the surface coverage of the EtO— groups. The mass gain observed using QCM is the net mass adsorbed upon EtOH adsorption. We are interested in two limiting scenarios: if EtOH reacts with a bridging oxygen, then the net mass incorporation on the surface corresponds to a whole EtOH molecule, as shown in Scheme 1(a). If, however, EtOH reacts with a geminal hydroxyl group, then the net mass gain will be that of an ethyl group [Scheme 1(b)].

EtOH(g)+M-O-M→EtO-M M-OH  (a)

EtOH(g)+HO-M→EtO-M+H$_2$O (g)  (b)

Scheme 1

Reaction Mechanisms Providing the Highest (a) and the Lowest (b) Net Mass Gain per Ethoxide group formed on a Metal Oxide Surface Schemes 1(a) and 1(b) provide upper an lower estimates of the surface coverage, respectively. In reality, the surface functionalization step may consist of a combination of different reaction pathways with unknown branching ratios, and therefore the net mass gain per functional group will be somewhere in between schemes 1(a) and 1(b). From our QCM data, we obtain a surface density of ethoxide groups between 1.3 and 2.0 EtO—/nm$^2$ for Al$_2$O$_3$ at 200° C. Similar calculations carried out for a TiO$_2$ surface yield a value between 1.4 and 2.2 EtO—/nm$^2$ at 200° C.

EXAMPLE 4

We have applied growth moderation using alkyl alcohols to the deposition of doped metal oxides by ALD, including Al-doped TiO$_2$, Sn-doped In$_2$O$_3$ and Al-doped ZnO. In the latter case, we compared the Nx(DEZ/H$_2$O)+(TMA/H$_2$O) sequence previously used in the literature with the EtOH moderated sequence: Nx(DEZ/H$_2$O)+(EtOH/TMA/H$_2$O). Resistivity measurements using four-point probe show that the use of growth moderators broadens the range of TMA/(TMA+DEZ) pulsing ratios in which low resistivity materials can be obtained, due to a lower density of Al dopants deposited per ALD cycle.

Figure 7:
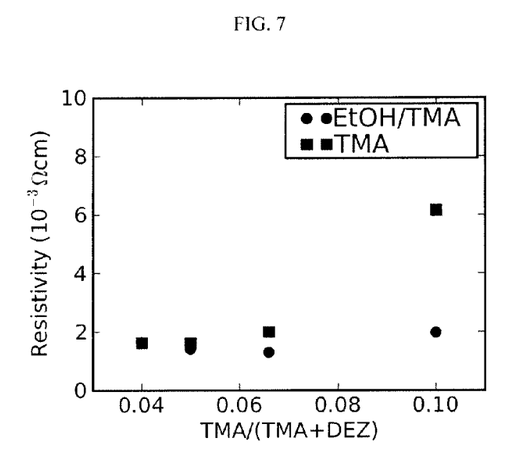
FIG. 7 illustrates resistivity of 80 nm Al:AnO films obtained by ALD as a function of the TMA/(TMA+DEZ) cycle ratio using both TMA/H$_2$O (squares) and EtOH/TMA/H$_2$O (circles) sequences for Al deposition.

The results presented in FIG. 7 correspond to 80 nm thick films. The differences are even more pronounced for nanoscale materials: for a total thickness of 12 nm, the use of moderators reduces the sheet resistance by a factor of three for sequences with a TMA:DEZ ratio of 1:14, when compared with a 40% improvement for 80 nm thick films. These results are promising for the applying this strategy to the growth of functional coatings on nanostructured electrodes to improve the electron collection efficiency in dye sensitized solar cells.

Controlled dopant distribution and higher doping efficiencies by surface-functionalized atomic layer deposition.

EXAMPLE 5

The use of acetone, acetylacetone and acetic acid all resulted in inhibition of the growth. We have showed that ozone and combinations of water and ozone can be used to remove the surface functional groups. The doping has been extended to Lanthanide precursors, for the growth of erbium doped metal oxides.

EXAMPLE 6

Figure 8:
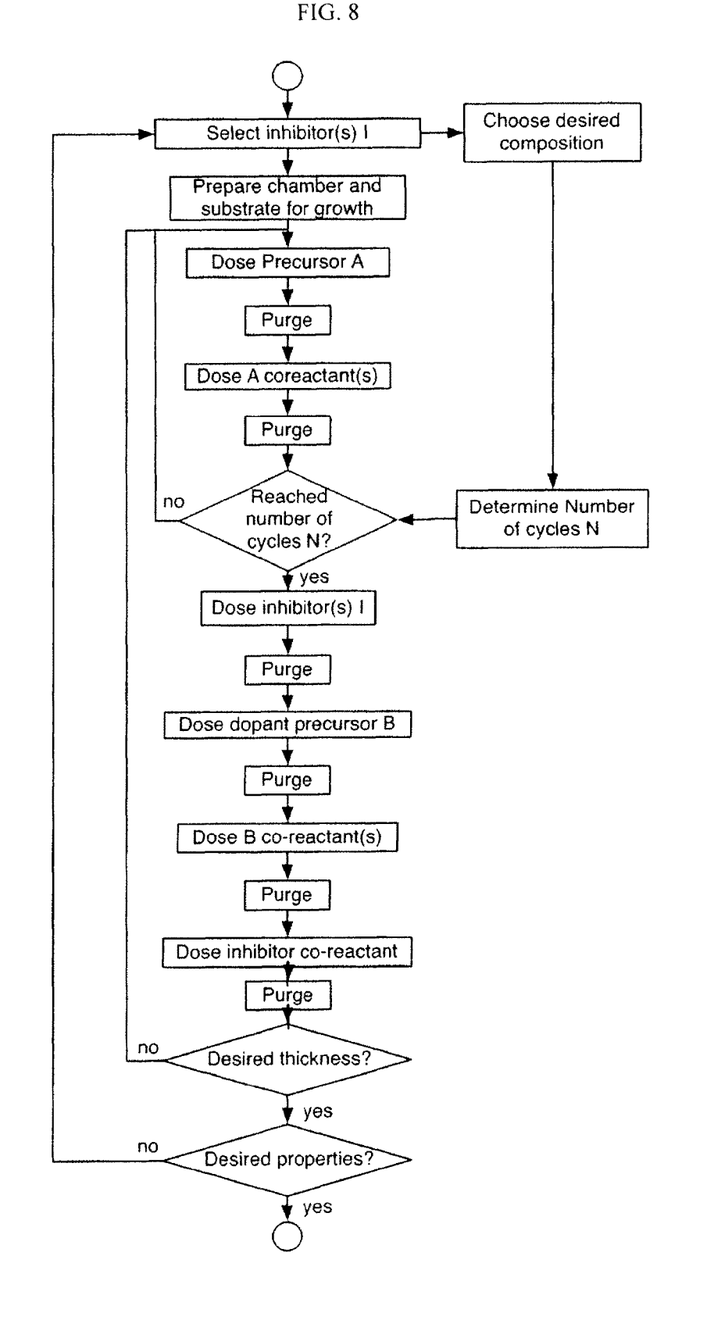
FIG. 8 illustrates an ALD specific method of preparing the metal oxides.
Figure 9:
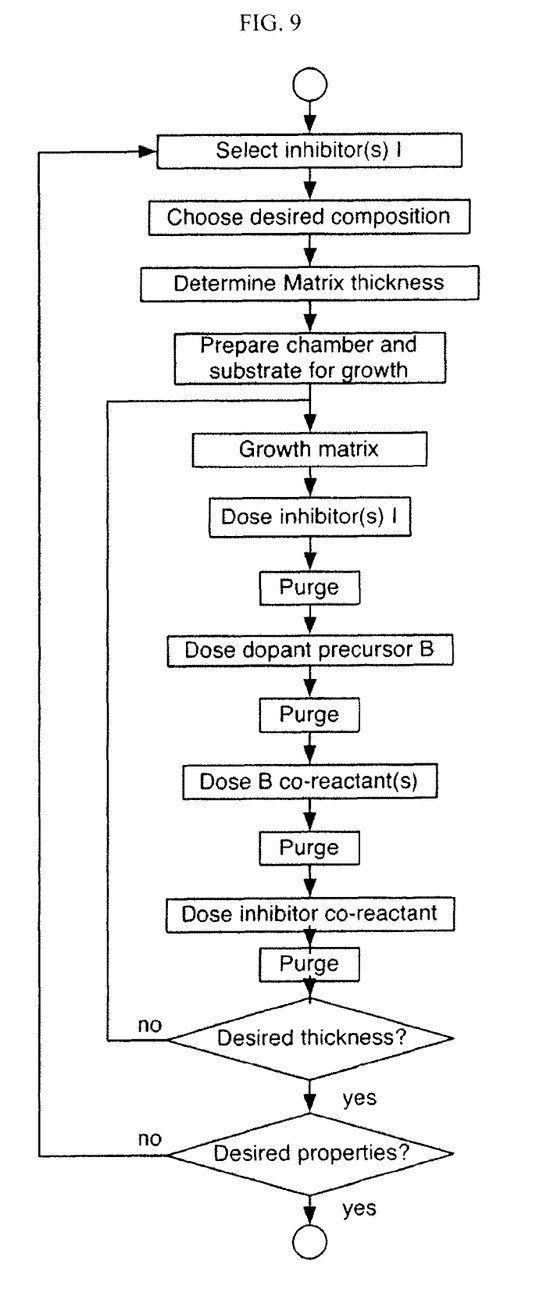
FIG. 9 illustrates a nonspecific growth method to prepare the metal oxides.

FIGS. 8 and 9 illustrate two example methods of carrying out the method of the invention. FIG. 7 shows an ALD specific method and FIG. 9 shows a matrix grown by a non-specific method using the same chemically constructed state as in FIG. 8.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described to explain the principles of the present invention and its practical application to enable one skilled in the art to utilize the present invention in various embodiments and with various modifications as are suited to the particular use contemplated. The features of the embodiments described herein may be combined in all possible combinations of methods, apparatus, modules and systems.

What is claimed is:

1. A method for producing a doped material of desired composition and thickness comprising the steps of:
   selecting a surface functionalization species;
   growing a first thickness of a host matrix material;
   dosing a surface functionalization species for controlling dopant wherein the surface functionalization species is chemically different than the host matrix and a dopant precursor and the surface functionalization species being non-reactive with the dopant precursor; and
   dosing the dopant precursor and wherein the surface functionalization species dose acts as a control for limiting precursor deposition on the first thickness of host matrix;
   dosing a dopant precursor co-reactant forming dopant on a portion of the host matrix;

dosing a surface functionalization species co-reactant to react with the surface functionalization species to obtain a desired surface chemistry for deposition of one or more additional layers of host matrix material thereby obtaining the doped material.

2. The method of claim 1 wherein the deposition system comprises an Atomic Layer Deposition system.

3. The method of claim 1 wherein the dopant is deposited using Atomic Layer Deposition to form a doped film.

4. The method of claim 1 further including the step of continuing cycling deposition of the surface functionalization species, dopant, dopant co-reactant and surface functionalization species co-reactant dose until achieving the desired thickness for the doped material.

5. The method as defined in claim 1, wherein the dopant co-reactant is selected from the group consisting of water, ozone, oxygen, atomic oxygen, hydrogen peroxide, hydrogen, atomic hydrogen, hydrogen sulfide, ammonia, hydrazine, nitrous oxide, atomic nitrogen, and any combination thereof.

6. The method as defined in claim 1, wherein the surface functionalization species co-reactant is selected from the group consisting of water, ozone, oxygen, atomic oxygen, hydrogen peroxide, hydrogen, atomic hydrogen, hydrogen sulfide, ammonia, hydrazine, nitrous oxide, atomic nitrogen, and any combination thereof.

7. The method as defined in claim 3, where the method for growing the host matrix is selected from the group of sputtering, evaporation, chemical vapor deposition, pulsed laser deposition, plasma assisted chemical vapor deposition and atomic layer deposition.

8. The method as defined in claim 3, where the surface functionalization species are selectively removed by a further step of providing a co-reactant.

9. The method as defined in claim 3, wherein the surface functionalization species is selected to obtain a desired chemical environment for the dopant in the host matrix.

10. The method of claim 3 where more than one surface functionalization species are input to obtain a desired chemical environment for the dopant in the host matrix.

11. The method as defined in claim 10, further including the step of inputting additional co-reactant doses after inputting the surface functionalization species to obtain a desired chemical environment for the dopant in the matrix host.

12. The method as defined in claim 3, where the surface functionalization species and the host thickness are changed during growth of the doped film to produce a desired doping concentration profile.

13. The method of claim 3 wherein the doped material is selected from the group of a metal oxide, metal sulfide, metal chalcogenide, metal nitride, metal halide and a metal.

14. The method as defined in claim 3, where the doped material comprises at least one of a transparent conducting oxide, a photoluminescent rare earth-doped metal oxide, a tunable resistance coating, a dielectric material for electronic devices, a wide-bandgap semiconducting material, or a catalyst.

15. The method as defined in claim 3, where the surface functionalization species is selected from the group of alcohol, ketone, aldehyde, beta diketone, hydrogen halide, and carboxylic acid.

16. The method as defined in claim 3 wherein the dopant precursor is selected from the group consisting of trimethyl aluminum, diethyl zinc, titanium tetrachloride, titanium tetraisopropoxide, erbium (III) tris-tetramethylheptanedionate, europium (III) tris-tetramethylheptanedionate, tetrakisdimethylamino tin, tetrakisdimethylamino zirconium, and bis-cyclopentadientyl magnesium.

17. The method as defined in claim 3 further including the step of controlling deposition temperature of the deposition system and the temperature is selected in the range of 50-250° C.

* * * * *